(12) United States Patent
Brand

(10) Patent No.: US 9,596,785 B2
(45) Date of Patent: Mar. 14, 2017

(54) HEAT EXCHANGER

(75) Inventor: Joseph H. Brand, Mississauga (CA)

(73) Assignee: Pratt & Whitney Canada Corp., Longueuil, Quebec (CA)

( * ) Notice: Subject to any disclaimer, the term of this patent is extended or adjusted under 35 U.S.C. 154(b) by 796 days.

(21) Appl. No.: 12/728,466

(22) Filed: Mar. 22, 2010

(65) Prior Publication Data

US 2011/0226445 A1  Sep. 22, 2011

(51) Int. Cl.
*F28F 11/00* (2006.01)
*H05K 7/20* (2006.01)
*F28F 3/12* (2006.01)

(52) U.S. Cl.
CPC ........... *H05K 7/20254* (2013.01); *F28F 3/12* (2013.01)

(58) Field of Classification Search
CPC ............................ H05K 7/20254; F28F 3/12
USPC ..................... 165/70, 169, 170; 361/699, 702
See application file for complete search history.

(56) References Cited

U.S. PATENT DOCUMENTS

| | | | | |
|---|---|---|---|---|
| 2,193,405 A | * | 3/1940 | Goodman | 165/70 |
| 3,099,520 A | * | 7/1963 | Hallstrom | 422/33 |
| 3,623,546 A | | 11/1971 | Banthin et al. | |
| 3,830,290 A | * | 8/1974 | Thamasett | G01M 3/3227 138/104 |
| 4,450,472 A | * | 5/1984 | Tuckerman et al. | 257/713 |
| 4,491,817 A | * | 1/1985 | Koyama | H01F 27/10 336/60 |
| 4,976,313 A | * | 12/1990 | Dahlgren et al. | 165/167 |
| 5,159,529 A | * | 10/1992 | Lovgren et al. | 361/699 |
| 5,178,207 A | * | 1/1993 | Bergqvist et al. | 165/70 |
| 5,193,612 A | * | 3/1993 | Stirnkorb | 165/167 |
| 5,245,693 A | * | 9/1993 | Ford et al. | 392/470 |
| 5,381,510 A | * | 1/1995 | Ford | A61M 5/44 165/169 |
| 5,692,558 A | | 12/1997 | Hamilton et al. | |
| 5,801,442 A | * | 9/1998 | Hamilton | H01L 23/473 257/712 |
| 6,302,190 B1 | | 10/2001 | Clamp et al. | |
| 6,367,543 B1 | * | 4/2002 | Calaman | F28F 3/022 165/134.1 |
| 6,396,692 B1 | | 5/2002 | Farshi et al. | |
| 6,721,181 B1 | * | 4/2004 | Pfeifer et al. | 361/704 |
| 6,907,920 B2 | | 6/2005 | Warburton et al. | |
| 6,988,534 B2 | | 1/2006 | Kenny et al. | |

(Continued)

FOREIGN PATENT DOCUMENTS

DE    EP 2389057 A1 * 11/2011 ............... F28F 3/12

OTHER PUBLICATIONS

Translation of EP2389057A1.*

*Primary Examiner* — Len Tran
*Assistant Examiner* — Claire Rojohn, III
(74) *Attorney, Agent, or Firm* — Norton Rose Fulbright Canada LLP

(57) ABSTRACT

A heat exchanger useful for mounting to an electronic component housing or other system requiring heat exchange. The heat exchanger has a manifold having a cross-sectional configured for providing an unequal coolant flow to an array of cooling channels fed by the manifold, thereby providing for preferential amounts of heat exchange over a given heat exchange surface of the heat exchanger. A safety channel may surround the channels carrying the coolant to prevent potential leakage outside of the heat exchanger.

14 Claims, 3 Drawing Sheets

(56) References Cited

U.S. PATENT DOCUMENTS

| | | | |
|---|---|---|---|
| 7,110,258 B2* | 9/2006 | Ding | F28D 15/0266 174/15.1 |
| 7,139,172 B2 | 11/2006 | Bezama et al. | |
| 7,190,580 B2* | 3/2007 | Bezama et al. | 361/699 |
| 7,259,965 B2 | 8/2007 | Chang et al. | |
| 7,337,836 B1* | 3/2008 | Persson | 165/167 |
| 7,353,859 B2* | 4/2008 | Stevanovic | H01L 23/473 165/170 |
| 7,427,566 B2 | 9/2008 | Durocher et al. | |
| 2005/0200001 A1* | 9/2005 | Joshi | F28F 3/08 257/712 |
| 2006/0096740 A1* | 5/2006 | Zheng | 165/104.26 |
| 2006/0108098 A1 | 5/2006 | Stevanovic et al. | |
| 2006/0225867 A1* | 10/2006 | Park | H05K 7/20254 165/80.4 |
| 2006/0231233 A1* | 10/2006 | Farid | F28D 15/0266 165/10 |
| 2007/0044940 A1* | 3/2007 | Shiozawa | G06F 1/1616 165/70 |
| 2007/0068652 A1* | 3/2007 | Park | H01L 23/473 165/80.4 |
| 2007/0091570 A1* | 4/2007 | Campbell | G06F 1/20 361/699 |
| 2007/0163765 A1* | 7/2007 | Rondier et al. | 165/153 |
| 2007/0215325 A1 | 9/2007 | Solovitz et al. | |
| 2007/0227708 A1* | 10/2007 | Hom | G06F 1/20 165/121 |

\* cited by examiner

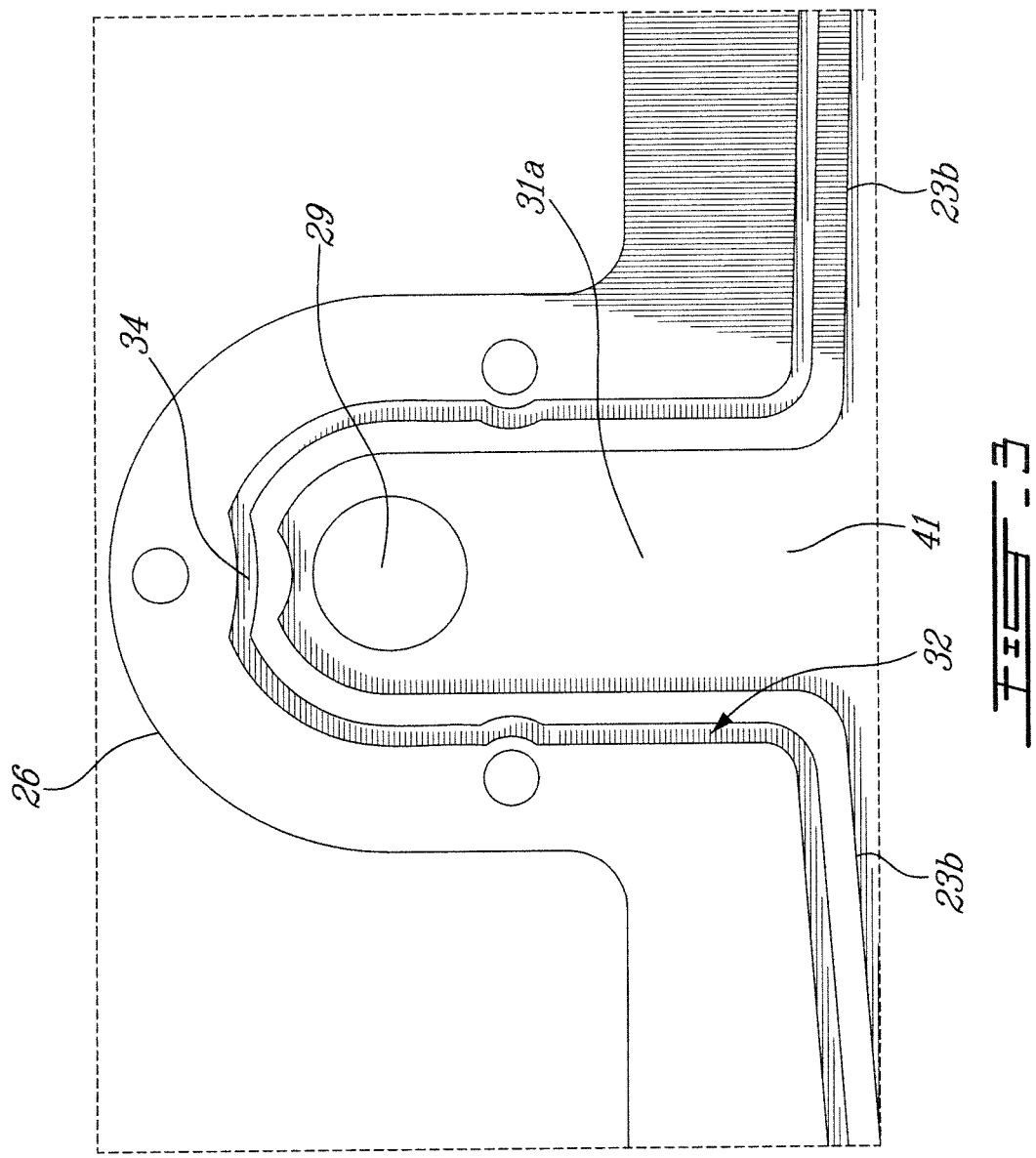

HEAT EXCHANGER

TECHNICAL FIELD

The technical field generally relates to heat exchangers, such as those used to cool power electronics or other apparatus or systems requiring heat exchange.

BACKGROUND

Electronic components used in power generation systems often create heat and as such are generally cooled. Although a variety of cooling options are available, in airborne applications the choices are typically limited by weight, cost, reliability, and so on. Furthermore, since devices requiring cooling may experience differential heating across their bodies, cooling systems must often be over-sized, or include complicated valving etc., to ensure all areas are adequately cooled. However, in airborne systems, there are associated cost, weight and/or reliability penalties with these prior art solutions which the designer has heretofore had no choice but to accept. Hence, there remains a need for improved heat exchange solutions.

SUMMARY

There is provided a heat exchanger comprising: a body having a plurality of cooling channels defined therein, and a fluid supply manifold located at a first end of the cooling channels, the fluid supply manifold being in parallel fluid flow communication with the cooling channels for feeding coolant thereto, the fluid supply manifold having a cross-sectional area which varies over its length and thereby configured for providing greater coolant flow to cooling channels fed by portions of the fluid supply manifold having a greater cross-sectional area than remaining portions of the fluid supply manifold.

There is also provided a heat exchanger comprising a first plate having a first surface, and a second plate, the second plate abutting the first surface of the first plate in sealing engagement, the first plate and the second plate including therebetween: a plurality of cooling channels, a supply channel being in fluid-flow communication with the cooling channels for supplying coolant thereto, a discharge channel being in fluid-flow communication with the cooling channels for discharging fluid therefrom, and a safety channel circumscribing the cooling channels, the supply channel and the discharge channel for collecting any coolant leakage therefrom, the first plate having a second surface opposite the first surface, the first surface cooling the second surface when coolant flows through the cooling channels.

There is further provided a heat exchanger comprising: a first plate having two protrusions on opposite sides thereof, the first plate having an undersurface having a plurality of cooling channels defined therein in a side-by-side parallel configuration, a fluid supply channel located at a first end of the cooling channels and disposed transversally with respect to the cooling channels, the fluid supply channel being in fluid flow communication with the cooling channels for feeding coolant thereto, a fluid removal channel located at a second end, opposite the first end, of the cooling channels and disposed transversally with respect to the cooling channels, the fluid removal channel being in fluid flow communication with the cooling channels for removing fluid therefrom, a fluid connection inlet for connection with a coolant supply source for providing coolant to the heat exchanger and which is in fluid flow communication with the fluid supply channel, the fluid connection inlet being provided at a first one of the two protrusions, a fluid connection outlet for connection with a coolant exhaust so as to discharge coolant from the heat exchanger and which is in fluid flow communication with the coolant removal fluid channel, the fluid connection outlet being provided at a second one of the two protrusions, a second plate coupled with the undersurface of the middle plate so as to seal the cooling channels, the fluid supply channel, the fluid removal channel, the fluid connection inlet and fluid connection outlet; wherein the first plate includes a top surface in heat exchange relationship with components to be cooled, the coolant flowing through the cooling channels on the undersurface of the first plate removing heat from the top surface of the first plate.

DESCRIPTION OF THE DRAWINGS

Reference is now made to the accompanying figures, in which:

FIG. 3 is an enlarged view of section A of the plate shown in FIG. 2.

DETAILED DESCRIPTION

Figure 1:
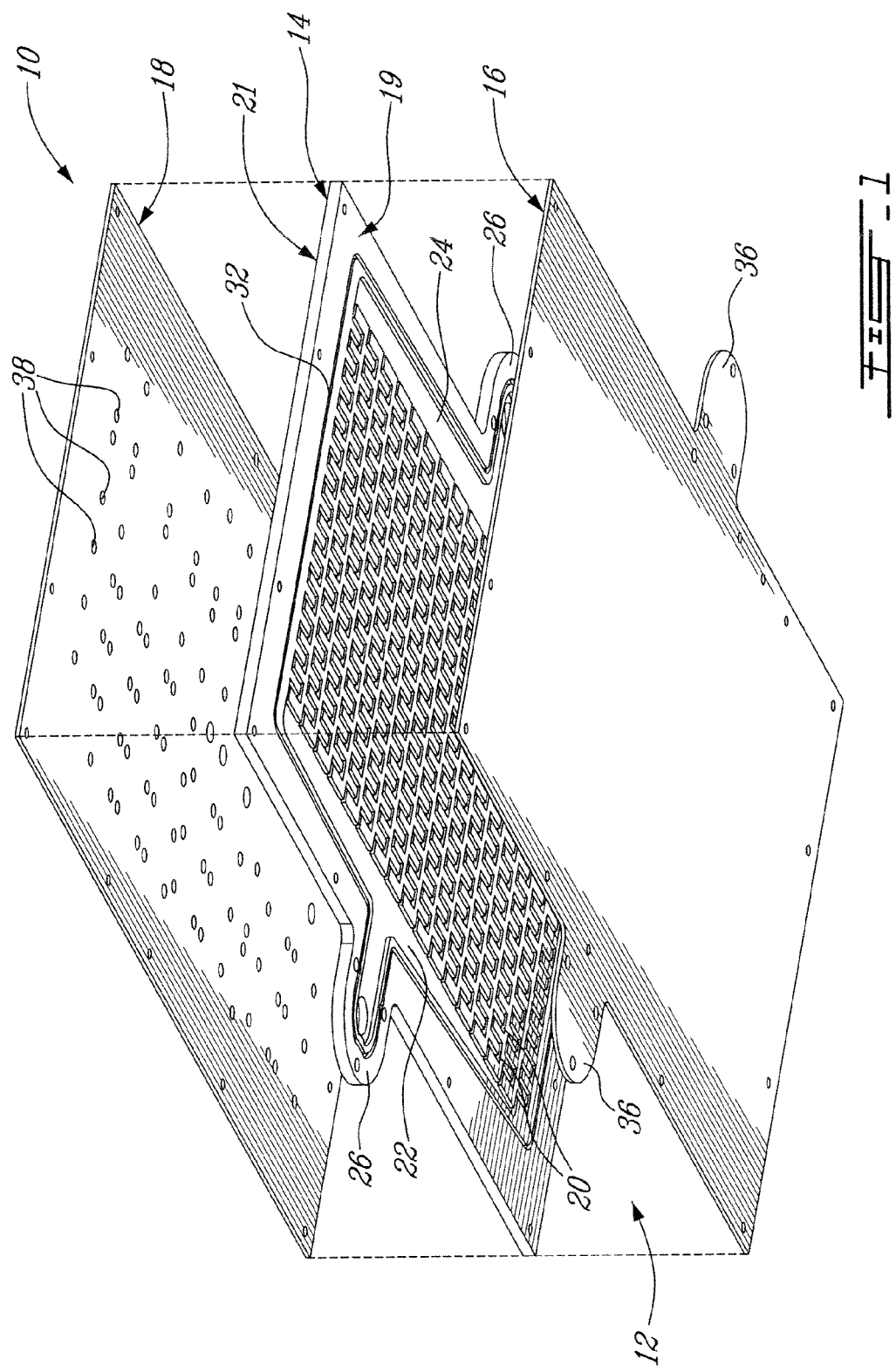
FIG. 1 is an exploded view of an embodiment of a heat exchanger including an upper plate, a middle plate and a bottom plate.

A heat exchanger for a heated surface is generally shown at 10, as seen in detail on FIG. 1, which shows an exploded view of the heat exchanger 10. The heat exchanger 10 can be used to remove heat losses from power electronic equipment or electronic components. The heat losses may be transferred to a coolant passing through the heat exchanger 10.

In one embodiment, the heat exchanger 10 comprises a body or housing 12 on top of which electronic components (not shown) may be located. The housing 12 of the heat exchanger 10 comprises three main components, a middle plate 14, a bottom plate 16 positioned under the middle plate 14, and a top plate 18 positioned over the middle plate 14. The three plates 14, 16, 18 can be made of aluminum, but may alternatively be made from other types of heat conducting material, for example copper etc.

Figure 2:
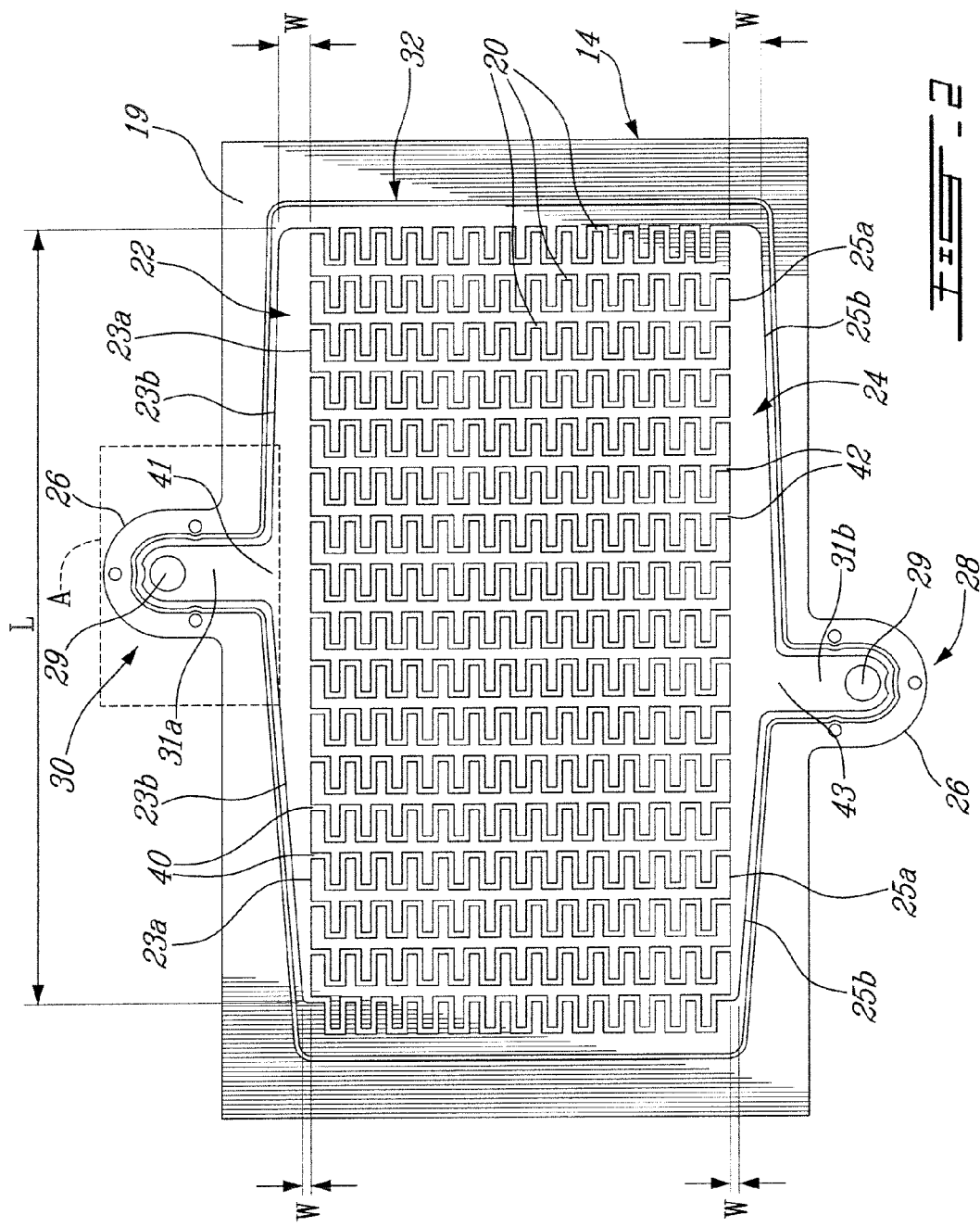
FIG. 2 is a bottom plan view of a plate of the heat exchanger of FIG. 1.

As seen in FIG. 2, the middle plate 14 has an undersurface 19 including a series of cooling channels 20 defined therein and located in a side-by-side arrangement, a fluid supply channel 24 in fluid flow communication with a first end of the cooling channels 20 for supplying coolant thereto and a fluid discharge channel 22 in fluid flow communication with a second opposed end of the cooling channels 20 for discharging coolant therefrom. The supply and discharge channels 24 and 22 are facing each other from opposed sides of the cooling channels 20 and are transversely disposed with respect thereto. The middle plate 14 has a generally rectangular contour except for two protrusions 26, the protrusions 26 being located on opposite longitudinal sides of the middle plate 14 and being located in the same horizontal plane as the housing 12. The two protrusions 26 are slightly laterally offset to provide correct assembly. As will be seen hereinafter, one of the protrusions 26 provides for a fluid inlet connection 28, while the other protrusion 26 provides for a fluid outlet connection 30 when the bottom plate 16 is assembled to the middle plate 14. The fluid inlet connection 28 is in fluid flow communication with the fluid supply channel 24 for supplying fluid thereto, whereas the fluid outlet connection 30 is in fluid flow communication with the fluid discharge manifold 22 for discharging fluid therefrom. In addition, the middle plate 14 includes a safety channel 32 defined in the undersurface 19 and circumscribing the cooling channels 20, the fluid supply and fluid discharge channels 24, 22 and the fluid inlet and fluid outlet connections 28, 30.

The cooling channels 20 are provided for having coolant flow therethrough. The cooling channels 20 may have a zigzag type configuration with rectangular cross sections, which in the embodiment shown, are all identical. In another embodiment, the cooling channels 20 may have different configurations with respect to one another. The cooling channels geometry depicted in the Figures is defined for laminar flow at relatively low Reynolds number of the coolant flow, as described in co-pending application publication number 2009/0255652 from Pratt & Whitney Canada, the entire content of which application is incorporated herein by reference.

The fluid inlet and outlet connections 28, 30 include connection openings 29 which extend through respective protrusions 26 of the middle plate 14 and which may accommodate a fluid inlet component (not shown) and a fluid outlet component (not shown), respectively, such as to provide a coolant inlet and a coolant outlet, respectively, into and out of the heat exchanger 10. The fluid inlet component and the fluid outlet component may be for example, fluid pumps. The fluid inlet and outlet connections 28, also include fluid channels 31b, 31a, respectively, which interconnect the connection openings 29 and the fluid channels 22, 24.

The fluid supply channel 24 and the fluid discharge channel 22 are positioned transversely with respect to the cooling channels 20. The fluid supply channel 24 has an inner wall 25a located adjacent the cooling channels 20 and including openings 42 therein for supplying coolant to the cooling channels 20 and an outer wall 25b located opposite the inner wall 25a and including an opening 43 for receiving fluid from the fluid channel 31b of the fluid inlet connection 28, the width W of the supply channel 24 being defined as the distance between inner wall 25a and outer wall 25b. The fluid discharge channel 22 has an inner wall 23a located adjacent the cooling channels 20 and including openings 40 therein for discharging coolant from the cooling channels 20 and an outer wall 23b located opposite the inner wall 23a and including an opening 41 for directing fluid into the fluid channel 31a of the fluid outlet connection 30, the width W of the discharge channel 22 being defined as the distance between inner wall 23a and outer wall 23b. As seen in FIG. 2, the inner walls 23a and 25a are generally straight, whereas the outer walls 23b and 25b may be oblique, skewed and/or curved, such that the channels 22, 24 have widths W which vary over their respective lengths L. In the embodiment shown, the fluid supply channel 24 and the fluid discharge channel 22 have a constant depth, and the widths W determine the size of the cross-sectional area at various locations of the channels 22, 24.

In the embodiment shown in FIG. 2, the fluid supply channel 24 and the fluid discharge channel 22 are unequal and may be skewed, such that their cross-sectional areas are not constant and vary throughout their respective lengths L. As shown in FIG. 2, the channels 22 and 24 may have the same profile variation or cross-sectional change along the length thereof (i.e. they can be a mirror image of each other). The channels 22 and 24 have greater cross-sectional areas at locations where they have a wider width W and smaller cross-sectional areas at locations where they have a smaller width W. The fluid supply channel 24 and the fluid discharge channel 22 both contribute to unequal coolant flow across individual cooling channels 20, as more coolant is provided in and removed from, respectively, the cooling channels 20 positioned adjacent where the channels 22, 24 have a larger cross-sectional area. As such, it is possible to provide more coolant flow in certain cooling channels 20, even though each cooling channel 20 has an identical configuration. For instance, in the example illustrated in FIG. 2, more coolant flow can be provided to the cooling channels 20 disposed on the right hand side of the page than to the cooling channels 20 located on the left hand side of the page. This provides for greater cooling for the devices mounted on the ring hand side of the heat exchanger. Accordingly, devices required added cooling can be mounted on that side of the heat exchanger, thereby obviating the need for complex valve system for regulating the flow through the cooling channels in order to provide differential cooling across the surface of the heat exchanger body.

The safety channel 32 is a closed-loop channel surrounding the cooling channels 20, the fluid supply and fluid discharge manifolds 24, 22 and the fluid inlet and fluid outlet connections 28, 30. The safety channel 32, in the case of a fluid leak, receives any fluid leakage from the cooling channels 20, the fluid supply and fluid discharge manifolds 22, 24 and the fluid inlet and fluid outlet connections 28, 30, and contains the fluid leakage, such that the fluid is prevented from leaking outside of the heat exchanger 10. The safety channel 32 has at least one evacuation hole 34 (FIG. 3) formed therein, for evacuating in a controlled way, any fluid leakage received inside the safety channel 32. In the embodiment shown, the evacuation hole 34 is at an outer periphery extremity of the protrusion 26 in which is provided the outlet connection 30. The evacuation hole 34 may be connected to a device to collect, evacuate and signal the presence of fluid inside the safety channel 32, thereby indicating a fluid leak in the heat exchanger 10. The safety channel 32 is connected to an environment pressure at the evacuation hole 34, the fluid leakages in the safety channel naturally flowing towards the environment pressure.

As shown in FIG. 1, the middle plate 14 has a top surface 21, opposite the undersurface 19, which may be heated and as such, heat may be transferred from the top surface 21 into coolant passing through the cooling channels 20 of the undersurface 19, thereby cooling the top surface 21. The top surface 21 includes the connection openings 29 of the fluid inlet and outlet connections 28, 30.

As seen in FIG. 1, the bottom plate 16 has a generally similar rectangular contour as that of the middle plate 14, including protrusions 36 which have the same shape as the protrusions 26 of the middle plate 14. The bottom plate 16 is coupled to the middle plate 14, thereby superimposing the undersurface 19 of the middle plate 14 and closing off and sealing a bottom portion of the cooling channels 20, the fluid supply channels 24, the fluid discharge channels 22, fluid channels 31b, 31a of the fluid inlet and outlet connections 28, 30 and the safety channel 32 defined in the middle plate 14. The bottom plate 16 may be coupled to the middle plate 14 using for example, diffusion bonding. As mentioned, the connection openings 29 of the fluid inlet and outlet connections 28, 30 pass through the middle plate 14, and as such, these openings 29 remain unsealed on the top surface 21 of the middle plate 14. Therefore, a fluid inlet component (not shown) and a fluid outlet component (not shown) may be accommodated by the connection openings 29 on the top surface 21.

In an alternative embodiment, the bottom plate 16 may be coupled to the middle plate 14, and the cooling channels 20, the fluid supply channel 24, the fluid discharge channel 22, the inlet and outlet fluid channel 31b, 31a and the safety channel 32 may be formed between the plates 14, 16, i.e. partly in the middle plate 14 and partly in the bottom plate 16, such that a portion of these elements lies in the middle plate 14 and an opposite portion of these elements lies in the bottom plate 16. The various channels could also be only defined in the top surface of the bottom plate with the middle plate acting as a cover for sealing the top surface of the bottom plate.

It is also understood that the cooling channels 20, the fluid supply channel 24, the fluid discharge channel 22, the fluid inlet and outlet channels 31b, 31a and the safety channel 32 may be formed in different plates. For example, the safety channel 32 and the cooling channels 20 may be formed in the middle plate 14, whereas the fluid supply channel 24, the fluid discharge channel 22, the fluid inlet channel 31b, and the fluid outlet channel 31a may be formed in the middle plate 16. Other such combinations are possible in various other embodiments.

As seen in FIG. 1, the top plate 18 has a similar rectangular structural contour as that of the middle and bottom plates 14, 16, but without the protrusions 26, 36. The top plate 18 may carry heat-emitting components (not shown) thereon, for example electronic components. These components may be attached to the top plate 18 using various fasteners, types of bonding or adhesives. In the embodiment shown, the top plate 18 has a plurality of holes 38, with fasteners (not shown) being inserted into the holes 38 in order to attach electronic components thereto. In the embodiment shown, the holes 38 include threaded inserts (not shown) therein and the electronic components are attached thereto with bolts (not shown).

The top plate 18 may be connected to the middle plate 14 using various bonding materials, such as for example, relatively low temperature soldering or a high temperature epoxy-silver adhesive. The soldering or the adhesive serve to facilitate low thermal resistance between the top plate 18, having the electronic components thereon which are sources of heat, and the remainder of the housing 12, namely the middle and bottom plates 14, 16, which is cooled using the coolant. As such, heat transfer from the top plate 18 to the middle and bottom plates 14, 16 is enhanced, thereby providing additional cooling to the top plate 18.

The electronic components attached to the top plate 18 create heat losses which raise the temperature of the top plate 18, and create the need for cooling. The middle and bottom plates 14, 16 may therefore be mounted to the top plate 18 in order to provide cooling thereto. In use, a fluid inlet component is attached to the connection opening 29 of the fluid inlet connection 28 of the heat exchanger 10 and provides coolant thereto. The coolant flows enters the heat exchanger 10 and flows through the fluid inlet passages and the fluid supply manifold formed by the inlet channel 31b, the supply channel 24 and the channel sealing bottom plate 16. The coolant then flows into the cooling channels 20, different amounts of coolant flow being provided to the various cooling channels 20 as a function of the size of the supply manifold along the inlet end of the array of cooling channels 20. The cooling channels 20 which are located in areas where the supply channel 24 has a greater cross-section will receive more coolant flow than the cooling channels 20 that are located in areas where the supply channel 24 has a smaller cross-section. The coolant leaves the cooling channels 20 and enters the fluid discharge channel 22 which is sealed by the bottom plate 16 to form a fluid discharge manifold. Thereafter, the coolant enters the fluid passages 31a and proceeds to exit the heat exchanger 10 through the connection opening 29 of the fluid outlet connection 30. A fluid outlet connection attached to the connection opening 29 of the fluid outlet connection 30 may then receive the coolant flow for further usage.

The cooling is provided by heat transfer from the top plate 18 to the middle plate 14 and into the coolant flowing through the cooling channels 20, the heat losses of the electronic components thereby being transferred to the coolant. Due to the use of different electronic components and different positioning configurations of the electronic components on the top plate 18, the top plate 18 may experience variations in temperature, such that the top plate has a higher temperature at certain locations and a lower temperature at other locations. As such, it may be necessary to vary the amount of cooling provided at different locations of the top plate 18. As seen above, this may be achieved by varying the cross-sectional areas of the unequal fluid supply and fluid discharge channels 22, 24, such that more coolant is provided in cooling channels 20 adjacent where the locations of the top plate 18 have a higher temperature and require additional cooling.

The coolant used with the heat exchanger may be any heat transfer fluid including flammable liquids like jet fuel. Because the second surface 21 of the first plate 14 is interposed between the holes 38 in the third plate 18 and the cooling channels 20, the coolant flowing through the cooling channels 20 is prevented from leaking through the holes 38 and contacting the electronic components located on the third plate 18. The heat exchanger is specifically designed to be able to safely accommodate flammable liquids as a coolant.

The above description is meant to be exemplary only, and one skilled in the art will recognize that changes may be made to the embodiments described without departing from the scope of the invention disclosed. For example, it is apparent that the present heat exchanger could be used to exchange heat (i.e. to heat or cool) any suitable surface, object or fluid adjacent the assembly. Any suitable arrangement of heat-exchanging conduits may be employed. The heat exchanger need not be plate-like, but may be any suitable configuration. Still other modifications which fall within the scope of the present invention will be apparent to those skilled in the art, in light of a review of this disclosure, and such modifications are intended to fall within the appended claims.

The invention claimed is:

1. A heat exchanger for cooling electronic components having different cooling requirements comprising:
a body having a plurality of cooling channels defined therein, and a fluid supply manifold located at a first end of the cooling channels, the cooling channels being arranged side-by-side and extending from the first end to a second end, the cooling channels being fluidly isolated from each other to convey coolant therethrough at laminar flow at relatively low Reynolds numbers, the fluid supply manifold being in fluid flow communication with the cooling channels for feeding the coolant thereto, the fluid supply manifold having an inlet opening and first and second lateral portions extending laterally from opposed sides of the inlet opening and transverse to the cooling channels, the first and second lateral portions being asymmetric relative to one another for providing different coolant flow to cooling channels respectively fed by the first and second lateral portions, an electronic component mounting plate mounted to an outwardly facing surface of the body, the electronic component mounting plate being connected in heat exchange relationship with the body, the electronic component mounting plate having mounting holes on an outer surface thereof for mounting of electronic components having different cooling requirements;

wherein the different coolant flow provided by the first and second lateral portions of the fluid supply manifold to the cooling channels defines, upon flowing through the cooling channels, different cooling temperature locations on the outer surface of the mounting plate, each electronic component being positionable on the mounting plate to match the cooling requirement of said electronic component with one of said cooling temperature locations, and a fluid removal manifold located at the second end, opposite the first end, of the cooling channels, the fluid removal manifold being in fluid flow communication with the cooling channels for removing fluid therefrom, the fluid removal manifold having a cross-sectional area which varies over a length thereof in a direction transversal to the cooling channels, wherein portions of greater cross-sectional area of the fluid removal manifold and of the fluid supply manifold are generally aligned and in fluid communication with the same cooling channels.

2. The heat exchanger according to claim 1, wherein the cooling channels are uniformly distributed over a surface of the body and spaced-apart along the length of the fluid supply manifold.

3. The heat exchanger according to claim 1, wherein the fluid supply manifold has a first inner wall located adjacent the cooling channels and including a first set of openings for connection thereto and a first outer wall including an inlet opening therein, the first inner wall being straight, the first outer wall being angled with respect to the first inner wall, the fluid discharge manifold having a second inner wall located adjacent the cooling channels and including a second set of openings for connection thereto and a second outer wall including an outlet opening therein, the second inner wall being straight, the second outer wall being angled with respect to the second inner wall, the first and second outer walls having a different slope.

4. The heat exchanger according to claim 1, wherein the fluid removal manifold has a fluid connection outlet adapted to be connected to a coolant exhaust so as to discharge coolant from the heat exchanger, the fluid connection inlet and the fluid connection outlet being laterally offset from the inlet opening of the fluid supply manifold.

5. The heat exchanger according to claim 1, wherein a safety channel circumscribes the plurality of cooling channels, the fluid supply manifold and the fluid removal manifold for receiving fluid leakage therefrom, the safety channel controlling said fluid leakage if a leak in the cooling channels occurs, an evacuation hole being located inside the safety channel for evacuating fluid therefrom.

6. The heat exchanger according to claim 1, wherein the cross-section of the fluid supply and removal manifolds varies equally along the length thereof.

7. A sealed fuel-cooled heat exchanger for airborne application, comprising a first plate having a first surface, and a second plate, the second plate abutting the first surface of the first plate in sealing engagement, the first plate and the second plate including therebetween: a plurality of cooling channels in said first surface, the plurality of cooling channels being fluidly isolated from each other to convey coolant therethrough at laminar flow at relatively low Reynolds numbers, a supply channel being in fluid-flow communication with the cooling channels for supplying jet fuel thereto, a discharge channel being in fluid-flow communication with the cooling channels for discharging fluid therefrom, and a safety channel circumscribing the cooling channels, the supply channel and the discharge channel; the safety channel defining a closed peripheral loop for collecting any jet fuel leakage from any one of the cooling channels, the supply channel and the discharge channel; the first plate having a second surface opposite the first surface, the first surface cooling the second surface when jet fuel flows through the cooling channels, wherein a third plate is coupled with the second surface of the first plate, the third plate having mounting holes distributed over a surface thereof for receiving a first set of electronic components and a second set of electronic components, the first set of electronic components having a higher cooling requirement than the second set of electronic components, the first plate being connected in heat exchange relationship with the third plate, and wherein the supply and discharge channels are configured to provide differential cooling across the surface of the third plate, said surface of said third plate defining different cooling temperature locations for receiving the first and second sets of electronic components in selected ones of said cooling temperature locations, wherein the supply channel is located at a first end of the cooling channels and the discharge channel is located at a second end of the cooling channels, the supply channel and the discharge channel being disposed transversely with respect to the cooling channels, the supply channel and the discharge channel having cross-sectional areas which vary over their respective lengths in a direction transversal to the cooling channels, and wherein the supply channel has an inlet opening and first and second lateral portions extending from opposed sides of the inlet opening, the first and second lateral portions being asymmetric relative to one another.

8. The heat exchanger according to claim 7, wherein the safety channel has a fluid evacuation hole formed therein, such that jet fluid leaks in the heat exchanger may be recovered in the safety channel and evacuated through the fluid evacuation hole, the safety channel being connected to an environment pressure at the fluid evacuation hole.

9. The heat exchanger according to claim 8, wherein the first and second plates include two protrusions superimposed one over the other, a portion of the safety channel being located on the protrusions, the evacuation hole being formed in the portion of the safety channel which is located on the protrusion.

10. The heat exchanger according to claim 7, wherein the cooling channels are in a side-by-side arrangement between the supply channel and the discharge channel.

11. The heat exchanger according to claim 7, wherein the first plate has a fluid connection inlet for connection with a coolant supply source for providing coolant to the heat exchanger and which is in fluid flow communication with the fluid supply channel, and a fluid connection outlet for connection with a coolant exhaust so as to discharge coolant from the heat exchanger and which is in fluid flow communication with the coolant discharge channel, the safety channel also circumscribing the fluid connection inlet and the fluid connection outlet.

12. A heat exchanger comprising:
a first plate having two protrusions on opposite sides thereof, the first plate having an undersurface having a plurality of cooling channels defined therein in a side-by-side parallel configuration, the plurality of cooling channels being fluidly isolated from each other to convey coolant therethrough at laminar flow at relatively low Reynolds numbers, a fluid supply channel located at a first end of the cooling channels and disposed transversally with respect to the cooling channels, the fluid supply channel being in fluid flow communication with the cooling channels for feeding coolant thereto, a fluid removal channel located at a second end, opposite the first end, of the cooling channels and disposed transversally with respect to the cooling channels, the fluid removal channel being in fluid flow communication with the cooling channels for removing fluid therefrom, a fluid connection inlet for connection with a coolant supply source for providing coolant to the heat exchanger and which is in fluid flow communication with the fluid supply channel, the fluid connection inlet being provided at a first one of the two protrusions, a fluid connection outlet for connection with a coolant exhaust so as to discharge coolant from the heat exchanger and which is in fluid flow communication with the coolant removal fluid channel, the fluid connection outlet being provided at a second one of the two protrusions, a second plate coupled with the undersurface of the first plate so as to seal the cooling channels, the fluid supply channel, the fluid removal channel, the fluid connection inlet and fluid connection outlet; and a third plate mounted to a top surface of the first plate, the third plate being thermally coupled to the first plate, the third plate having a plurality of holes distributed over a top surface thereof for receiving electronic components in contact heat transfer, and wherein the cross-sectional areas of the fluid supply channel and of the fluid removal channel is configured to provide more coolant in cooling channels adjacent where the locations of the third plate have a higher temperature, the top surface of the third plate defining different cooling temperature locations for receiving electronic components of different cooling requirements in selected ones of said cooling temperature locations, the coolant flowing through the cooling channels on the undersurface of the first plate removing heat from the top surface of the first plate, and wherein the fluid supply channel and the fluid removal channel have a same profile variation along their respective lengths in a direction transversal to the cooling channels, and wherein the fluid supply channel has first and second lateral portions extending from opposed sides of the fluid connection inlet, the first and second lateral portions being asymmetric.

13. The heat exchanger according to claim 12, wherein the first plate has a rectangular structural contour with the two protrusions on opposite sides thereof, the second plate having a rectangular structural contour including two protrusions on opposite sides thereof, the first and second plate both extending in a horizontal plane and being of similar shape.

14. The heat exchanger according to claim 12, wherein the fluid connection inlet and the fluid connection outlet both include connection openings passing through the first plate, the second plate sealing the connection openings on the undersurface of the first plate, the connection openings remaining unsealed on the top surface of the first plate, wherein a fluid inlet component and a fluid outlet component may be accommodated by the connection openings on the second surface so as to form a coolant inlet and a coolant outlet of the heat exchanger.

* * * * *